United States Patent [19]

Nishizawa

[11] 3,836,999

[45] Sept. 17, 1974

[54] SEMICONDUCTOR WITH GROWN LAYER RELIEVED IN LATTICE STRAIN

[75] Inventor: Jun-Ichi Nishizawa, Sendai, Japan

[73] Assignee: Semiconductor Research Foundation, Kawauchi, City of Sendai, Japan

[22] Filed: Dec. 5, 1973

[21] Appl. No.: 421,858

Related U.S. Application Data

[63] Continuation of Ser. No. 181,321, Sept. 17, 1971, abandoned.

[30] Foreign Application Priority Data

Sept. 21, 1970 Japan ............................... 45-83257

[52] U.S. Cl. ..................................... 357/63, 357/58

[51] Int. Cl. ............................................. H01l 9/10

[58] Field of Search ............ 317/235 AQ, 235 AM, 317/235 AD

[56] References Cited

UNITED STATES PATENTS 3,778,687 12/1973 Chang ............................ 317/235 R

OTHER PUBLICATIONS

Edel, et al., I.B.M. Tech. Discl. Bull., Vol. 13, No. 3, August 1970, p. 632.

Yeh et al. Journal of Applied Physics, Vol. 39, No. 9, August 1968, p. 4266.

*Primary Examiner*—Martin H. Edlow
*Attorney, Agent, or Firm*—Robert E. Burns; Emmanuel J. Lobato; Bruce L. Adams

[57] ABSTRACT

A substrate of silicon intrinsic or highly doped with an impurity such as antimony has epitaxially grown on it a layer of silicon either highly doped with an impurity, for example, phosphorous or nearly intrinsic and doped with a neutral impurity such as tin to render the substrate equal to the grown layer in the lattice constant.

6 Claims, 13 Drawing Figures

PATENTED SEP 17 1974 3,836,999

SEMICONDUCTOR WITH GROWN LAYER RELIEVED IN LATTICE STRAIN

This is a continuation of application Ser. No. 181,321, filed Sept. 17, 1971 now abandoned.

BACKGROUND OF THE INVENTION

This invention relates to semiconductor bodies including at least one epitaxially grown layer of semiconductive material.

Up to now, a wide variety of semiconductive materials has been developed and involves, in addition to well known germanium (Ge) and silicon (Si) of the IV Group, III–V compounds such as gallium arsenide (GaAs) and gallium phosphide (GaP), II–VI compounds such as mercury telluride (HgTe) etc. Further semiconductive materials of multi-element system have been utilized to form semiconductor devices. An example of the multi-element system materials is one expressed by $Ga_x Al_{1-x}As$ in which aluminum (Al) is substituted for a part of gallium (Ga). In addition, semiconductor devices could be formed of Ge - Si alloys. In order that those semiconductive materials are caused to behave as functional elements or groups thereof included in semiconductor devices, the semiconductive materials are required to have predetermined structures, a predetermined conductivity type, predetermined impurity concentrations and/or distributions. To this end, the semiconductive materials have been subject to various treatments. For example, evaporation, diffusion, alloying and crystal growth techniques are utilized even as far as the formation of junctions including the p-n junction are concerned.

The epitaxial growth technique can utilize the liquid or gaseous phase as the case may be and is considered to be most excellent and most wide in its applications among the techniques as above described. This is because it is possible to epitaxially grow on the particular substrate or its equivalent a layer of semiconductive material to any desired thickness with the desired conductivity type, and any desired impurity concentration and distribution. At present, therefore, the process of epitaxially growing silicon from the gaseous phase has been general means indispensable to form semiconductor devices such as integrated circuitries of silicon. However, various problems have been encountered in epitaxially growing silicon on substrates or their equivalents from the gaseous phase. One of the serious problems will now be described.

Since the growth process is to grow a layer of semiconductive material on a substrate or its equivalent of similar or dissimilar semiconductive material different in impurity concentration, impurity distribution and/or conductivity type from that of the layer, the material of the grown layer can be different in lattice constant of crystal from that of the substrate leading to the inevitable development of a stress in the resulting structure. This will cause lattice defects such as strains stacking faults and/or dislocations in the grown crystal. In an extreme case, microcracks can be formed in the structure. It is well known that the lattice defects just described can have the great adverse effects upon the electric characteristics of the resulting semiconductor devices and particularly upon the voltage withstanding property, magnitude of reverse current, noise characteristic, reliability thereof etc. While this has led to a grave technical issue, its approaches thereto have given up only for reason of unavoidableness.

SUMMARY OF THE INVENTION

Accordingly, it is an object of the invention to prevent the lattice defects from occurring in a semiconductive material of an epitaxially grown layer due to a difference in lattice constant between the material of the grown layer and that of a layer underlying the grown layer whereby the resulting semiconductor devices are much improved in electrical characteristics.

The invention accomplishes this object by the provision of a semiconductor body relieved in lattice strain of crystal, including a substrative semiconductor layer, an epitaxially grown semiconductor layer disposed on the substrative layer, one of the two layers being of an intrinsic semiconductive material while the other layer is of a very extrinsic semiconductive material different in lattice constant from the intrinsic semiconductive material, and an additional element different in atomic radius from the material of the substrative layer and controllably introduced into the material of the grown layer during the epitaxial growth thereof with a concentration sufficient to render the materials of the substrative and epitaxially grown layers substantially equal in lattice constant to each other, the additional element being selected from the group consisting of tin, zirconium, hafnium, silicon, germanium, lead, conductivity imparting impurity elements of the III and V Groups, vanadium and niobium.

BRIEF DESCRIPTION OF THE DRAWING

The invention will become more readily apparent from the following detailed description taken in conjunction with the accompanying drawing in which.

Throughout the several Figures like reference numerals designate the corresponding or similar components.

DESCRIPTION OF THE PREFERRED EMBODIMENTS

Figures 1A, 1B, 2A, 2B, 3A, 3B, 4A, 4B, 5A, 5B, 6A, 6B, 6C:
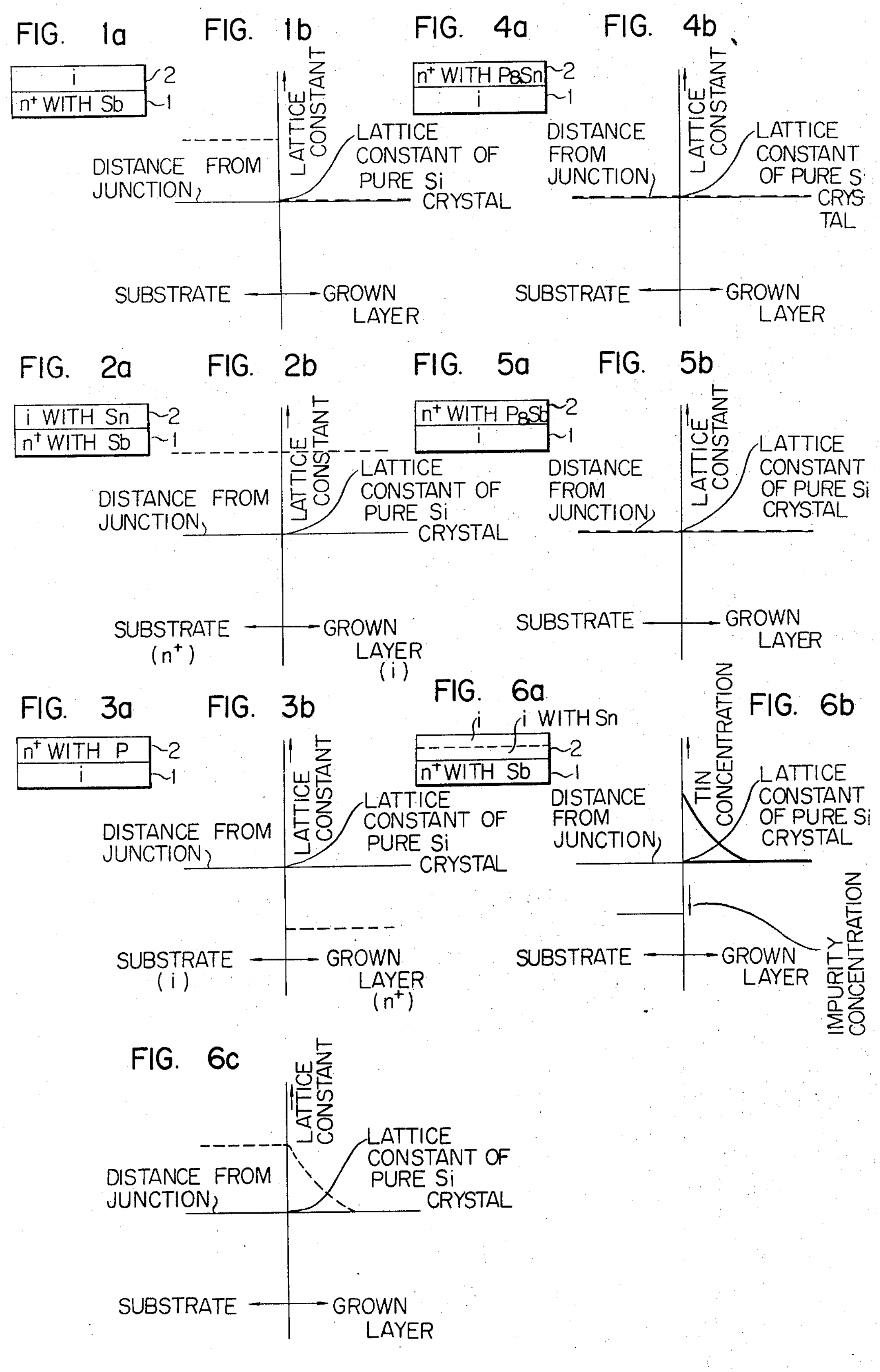
FIG. 1*a* is a schematic plan view of one portion of an i-on-$n^+$ junction formed in accordance with the principles of the prior art by epitaxial growth technique.
FIG. 1*b* is a graph typically plotting a lattice constant of a semiconductive material of each of two layers forming the i-on-n_i-on-$n^+$junction illustrated in FIG. 1*a* therebetween against a distance from the junction.
FIGS. 2*a* and *b* are a view and a graph similar to FIGS. 1*a* and *b* respectively but illustrating one form of the invention.
FIG. 3*a* is a schematic plan view of one portion of an $n^+$-on-i junction formed in accordance with the principles of the prior art by epitaxial growth technique.
FIG. 3*b* is a graph similar to FIG. 1*b* but illustrating the lattice constant on both sides of the $n^+$-on-i junction shown in FIG. 3*a;*
FIGS. 4*a* and *b* are a view and a graph similar to FIGS. 3*a* and *b* respectively but illustrating another form of the invention.
FIGS. 5*a* and *b* are a view and a graph similar to FIGS. 3*a* and *b* but illustrating a modification of the form of the invention shown in FIGS. 4*a* and *b.
* and FIGS. 6*a*, *b* and *c* are a view and graphs of concentration and lattice constant for another modification of the invention.

Referring now to FIG. 1*a* of the drawing, it is seen that a substrate 1 of any suitable semiconductive material, in this case, silicon highly doped with an n type conductivity imparting impurity such as antimony (Sb) or very extrinsic silicon has a layer 2 of intrinsic semiconductive silicon epitaxially grown on the $n^+$ type substrate to a predetermined thickness to form an i-on-$n^+$ junction therebetween. Then a layer of silicon highly doped with boron, for example, can be disposed on the epitaxially grown layer 2 by any of the processes well known in the art resulting in a semiconductor diode or rectifier having the p i n type configuration although the $p^+$ type layer is not illustrated in FIG. 1*a*. The p i n configuration is believed to be required for manufacturing silicon rectifiers capable of withstanding high reverse voltages.

A single crystal of pure silicon has a lattice constant of 5.4301A but if the crystal includes any impurity, the lattice constant thereof changes in accordance with the atomic radius and number of atoms of that impurity. If silicon doped with antimony is formed into a single crystal, this results in an increase in mean lattice constant because the antimony has a tetrahedral covalent radius of 1.36A while the silicon has a tetrahedral covalent radius of 1.17A. This change in lattice constant has no objection to the case the crystal is handled by itself. However, in other cases, for example, upon epitaxially growing a layer of intrinsic silicon on a substrate of $n^+$type silicon highly doped with antimony, the resulting structure has a lattice constant smaller for the grown i layer than for the $n^+$ type substrate. This is illustrated in FIG. 1*b*.

In FIG. 1*b* the axis of ordinates represents a lattice constant and the axis of abscissas passing through a point whose ordinate corresponds to the lattice constant of a pure silicon crystal represents a distance from the interface of the substrate and grown layer or the i-on-$n^+$junction as shown in FIG. 1*a*. FIG. 1*b* describes that the $n^+$ type substrate 1 lying on the left side of the axis of ordinates has a high lattice constant (see dotted line on that side) while the grown layer 2 lying on the right side thereof has a low lattice constant (see dotted line on the axis of abscissas).

Because of this difference in lattice constant between the materials of the substrate and grown layer, the process of growing the layer 2 proceeds so that the structure being grown inevitably becomes concave as viewed on the side of the grown layer. Thus, the two portions of the semiconductive material different in lattice constant from each other are formed into a unitary structure so that a difference in lattice constant between these two portions can causes, as a matter of course, a stress or a strain within the resulting crystal structure leading to the formation of dislocations etc. therein.

The invention contemplates to prevent the formation of lattice defects such as dislocations, stacking faults, micro-cracks as a result of the generation of an internal stress caused from a difference in lattice constant between two portions of a semiconductive material on both sides of a junction formed therebetween. According to the principles of the invention, a layer of semiconductive material is deposited on a semiconductor or its equivalent by epitaxial growth technique while an additional element other than that conductivity imparting impurity or element included in either one of the layer and substrate or its equivalent is added to the material of the layer being grown in the growth process in a direction to render the grown layer substantially equal to the substrate in lattice constant whereby a lattice strain is almost compensated for.

As above described, silicon crystals highly doped with antimony is greater in lattice constant than pure silicon crystals. Therefore, if it is desired to epitaxially grow a layer of intrinsic silicon or a single crystal of pure silicon on a substrate of $n^+$ type silicon including antimony then any of those elements electronically inert or neutral with respect to silicon and high in tetrahedral covalent radius than silicon, for example, tin (Sn) can be added to the grown *i* layer during its growth. (Such elements does not contribute to the determination of the conductivity type of semiconductive materials.) That is, the material of the grown layer can be doped with tin. More specifically, tin may be used as a carrier metal or added to the particular carrier metal in order to grow the layer from the liquid phase. Alternatively, if the gaseous phase is to be utilized, a chloride of tin such as tin tetrachloride ($SnCl_4$) may be mixed with a stream of hydrogen along with a source of silicon, for example, silicon tetrachloride ($SiCl_4$) generally used in growing silicon from the gaseous phase and reduced with the hydrogen to form the desired grown layer of intrinsic silicon on the $n^+$ type substrate.

FIG. 2*a* typically shows the resulting structure thus formed. The structure includes a substrate 1 of silicon highly doped with antimony (Sb) to an impurity concentration of about $1 \times 10^{19}$ atoms per cubic centimeter, and an epitaxially grown layer 2 of intrinsic silicon including the neutral tin (Sn) and disposed on the $n^+$ type substrate 1. Since the material of the substrate 1 is considered to be greater in lattice constant than intrinsic silicon by the order of $2 \times 10^{-4}$A, the tin can be added to the material of the layer 2 being grown having its impurity concentration of about 6 to $8 \times 10^{19}$ atoms per centimeter to render the lattice constant for the substrate 1 substantially equal to that for the grown layer 2 as shown at horizontal dotted line in the first and second quadrants in FIG. 2*b*. As an example, an arrangement such as shown in FIG. 2 could be produced by utilizing the above process at a growing temperature of 1,200°C with a ratio of silicon tetrachloride to hydrogen ranging from 0.005 to 0.05 and with a ratio of tin tetrachloride to silicon tetrachloride equal to 0.01 or less although those figures depend upon the particular growth conditions.

Thus it will be appreciated that the addition of tin to silicon has caused the lattice constant of the material of the grown layer to be substantially equal to that of the materi of the $n^+$ type substrate resulting in no stress occurring in the structure. Therefore the structure of FIG. 2*a* has been substantially free from lattice defects such as dislocations, micro-cracks etc.

It is to be noted that the invention exhibits no effect upon the thickness of the grown layer, and the impurity concentration, and the impurity distribution therein affecting the electrical design of semiconductor elements.

It is commonly practiced to disposed a layer a $n^+$ or $p^+$ type conductivity on a substrate of $p^+$ or $n^+$ type or intrinsic semiconductive material such as silicon, germanium or III–V compound to form a p-n junction or an ohmic junction therebetween. The invention is effectively applicable to such cases as far as crystal growtn technique is employed.

For example, if a layer of silicon highly doped with phosphorous (P) to be of an $n^+$ type is to be epitaxially grown on a substrate of intrinsic silicon to form a structure as shown in FIG. 3*a*, the material of the substrate 1 is smaller than lattice constant than that of the $n^+$ type layer 2 as shown at dotted line on the axis of abscissas and dotted line in the fourth quadrant of FIG. 3*b* because the phosphorous has a tetradhedral covalent radius of 1.10A smaller than that of the silicon having a value of 1.17A. This leads to an internal strain causing the resulting structure to tend to be bent toward the grown layer. For example, when an $n^+$ type layer of silicon including phosphorous were grown on a substrate of intrinsic silicon, the substrate with the grown layer began to be bent with an impurity concentration of about $3 \times 10^{19}$ atoms per cubic centimeter. Immediately after the reciprocal of the radius of curvature of the bent portion head reached about $15 \times 10^{-4}cm^{-1}$ (which corresponded to the grown layer having a thickness of from about 10 to about 20 microns for one of experiments), a multiplicity of dislocations were initiated to occur resulting from the misalignment or unconformity of lattices within crystal.

The invention prevents the occurrence of those dislocations by epitaxially growing the $n^+$ type layer whose material is highly doped with phosphorous while at the same time tin is added to the material. As an example, an $n^+$ type silicon layer including phosphorous with its concentration of $3.5 \times 10^{19}$ atoms per cubic centimeter was epitaxially grown on a substrate of intrinsic silicon while the silicon had simultaneously added thereto tin with its concentration ranging from about $1 \times 10^{19}$ to $1.5 \times 10^{9}$.

To this end, a source of silicon consisting of silicon tetrachloride ($SiCl_4$) mixed with phosphorous trichloride ($PCl_3$) in a proportion of phosphorous to silicon equal to 5,000 ppm could be maintained at 20°C in an evaporation vessel having a diameter of 10cm and a source of tin or tin chloride ($SnCl_4$) was kept at 30° in an evaporation vessel equal in dimension to the first vessel. Then the epitaxial growth process proceeded in the well known manner under the following conditions:

| | |
|---|---|
| Flow rate of hydrogen | 500 c.c./min. |
| Flow rate of hydrogen passed through silicon tetrachloride | 400 c.c./min. |
| Ratio of silicon tetrachloride to hydrogen | 0.015 |
| Flow rate of hydrogen through tin tetrachloride | 100 c.c./min. |
| Growing temperature | 1,200°C |
| Growth rate | 0.6 to 0.4 micron/min. |

The resulting structure is illustrated in FIG. 4*a*, and different from that illustrated in FIG. 3*a* only in that in FIG. 4*a* the grown layer 2 includes tin. However the material of the substrate 1 is substantially equal in lattice constant to that of the grown layer 2 as shown at dotted line lying on the axis of abscissas in FIG. 4*b*. That is, the addition of the tin increased the lattice constant of the material of the grown layer from a value represented by dotted line in the fourth quadrant of FIG. 3*b* to a value represented by dotted line lying on the axis of the abscissas of FIG. 4*b* with the result that the bending of the structure due to a difference in lattice constant was almost compensated for. This ensured that the dislocations etc. were completely prevented from occurring.

While the invention has been described in terms of the addition of tin for the purpose of increasing the lattice constant of the material of the grown layer, it is to be understood that the invention is not restricted thereto or thereby and that those elements capable of increasing the lattice constant may be equally used in practicing the invention. For example, antimony (Sb) serves to increase the lattice constant as above described in conjunction with FIGS. 1*a* and *b*. Therefore, antimony can be satisfactorily substituted for the tin in the structure shown in FIGS. 4*a* and *b*. The resulting structure is illustrated in FIGS. 5*a* and 5*b*. In that event, it is to be noted that antimony and phosphorous are n type conductivity imparting impurities belonging to the V Group. This means that for the growth of $n^+$ type layers, the invention may be practiced by utilizing additional elements of the same Group, as an n type conductivity imparting impurity involved, in this case, the V Groups. In other words, as those additional elements also serve to impart the n type conductivity to the grown layer, the use of any of such elements does not lead to a change in the particular electrical design.

While the invention has been illustrated and described in conjunction with $n^+$ type conductivity it is to be understood that the same is equally applicable to the $p^+$ type conductivity. Upon epitaxially growing a $p^+$ type layer on a substrate or its equivalent, boron is generally used to impart the p type conductivity to the layers being grown. As boron has a tetrahedral covalent radius of 0.88A which is smaller than that of silicon having a value of 1.17A grown layers of $p^+$ type silicon decrease in lattice constant as compared with the intrinsic silicon layer. It has been found that any of tin or gallium (Ga) (which has a tetrahedral covalent radius of 1.26A) or the like larger in tetrahedral covalent radius than silicon can be added to the particular source of silicon with boron in order to increase the lattice constant of the material of the grown layer thereby to relieve the lattice strain in the resulting structure. Since gallium and boron belong to the III Group and are acceptor impurities for silicon and germanium, two elements selected from the III Group can be used as the p type conductivity imparting impurity and the additional element according to the invention respectively to grow a $p^+$ type layer on a substrate or its equivalent with satisfactory results.

From the foregoing it will be appreciated that examples of the additional element for use with the invention involve those elements electronically inert or neutral with respect to the particular semiconductive material, such as tin, elements belonging to the same Group of the Periodic Table as an impurity for imparting a predetermined conductivity to that semiconductive material, such as antimony for the $n^+$ type semiconductive material, gallium for the $p^+$ type semiconductive material etc. In addition, semiconductor acceptor and donar impurities may be used with $n^+$ and $p^+$ type semiconductive materials respectively, unless the concentration of the impurity used causes changes in electric properties, for example, the inversion of the conductivity of and the re-distribution of the impurity in the associated semiconductive material etc. For example, if boron is introduced into a semiconductive material such as silicon to impart the $p^+$ type conductivity thereto to decrease the lattice constant thereof then antimony may be added to the silicon in a connection insufficient to change electric properties as above described along with boron.

For the purpose of causing the lattice constant of the material of the grown layer to be substantially equal to that of the material of the substrate or its equivalent, there has been selected that additional element whose atomic radius is larger or smaller than that of the pure silicon crystal as the case may be. However, it is to be understood that it is not always required to render the lattice constants for both layers substantially equal to each other, because the object of the invention is to relieve the lattice strain of the resulting structure. For example, upon growing a phosphorous doped silicon layer on a layer of intrinsic silicon, it is required only to simultaneously add the phosphorous and arsenic being of the same Group of the Periodic Table as phosphorous to the silicon to grow them on the intrinsic layer for the purpose of decreasing the generation of a stress within the grown layer caused from a difference in lattice constant thereof. In that event, the lattice strain can be relieved in the sense that the grown layer approximates in lattice constant the intrinsic layer although the former is impossible to be greater in lattice constant than the latter for the reason that arsenic has a tetrahedral covalent radius of 1.18A substantially approximating that of silicon. This is also within the scope of the invention.

From the foregoing it will be appreciated that the additional element introduced into the epitaxially group layer should tend to decrease a difference in lattice constant between the materials of the substrative and grown layers. This means that such an additional element is required to be greater or smaller in atomic radius or covalent radius than the particular semiconductive material as the case may be. Further the concentration of the additional element is determined to be sufficient to render both layers substantially equal to each other in lattice constant. Examples of those elements greater in covalent radius than silicon whose covalent radius is of about 1.17A involve lead, Pb(1.46A), indium, In(1.44A), tin, Sn(1.40A), antimony, Sb(1.36A), tellurium, Te(1.32A), gallium, Ga(1.26A), germanium, Ge(1.22A), arsenic, As(1.18A) etc. Examples thereof smaller in covalent radius than silicon involves carbon, C(0.77A), boron, B(0.88A), phosphorous, P(1.07A), selenium, Se(1.14A) etc. The parenthesized figures represent the covalent radii of the associated elements.

In the embodiments of the invention as above described, the lattice strain therein has been relieved by uniformly adding any of the additional element such as above described to the grown layer throughout the thickness thereof. Since the stress is high at and adjacent a junction formed between a pair of semiconductor region different in lattice constant from each other, the satisfactory results can also be given with a grown layer whose semiconductive material has added thereto an additional element such as above described having a graded concentration profile.

More specifically, the lattice constant of the material of the grown layer may be changed such that the lattice constant at and adjacent a junction formed between the grown layer and the associated substrate or its equivalent is substantially equal to that of the material of the substrate or its equivalent and then gradually decreased to a lattice constant of an intrinsic semiconductive material, for example, silicon of the grown layer as distance from the junction is increased. Thereafter the latter constant is kept at the value for the intrinsic material up to the exposed surface of the grown layer. Such a change in lattice constant is shown in FIG. 6*c*.

To this end, any suitable additional element as above described, for example, tin can be added to the grown layer of intrinsic semiconductive material, for example, silicon in such a graded concentration that the tin concentration at and adjacent the junction causes the lattice constant of the material of the grown layer to be substantially equal to that of the material of the associated $n^+$ type substrate or its equivalent highly doped, for example, with antimony and then gradually decreased to a zero value as the distance from the junction is increased. In the remaining portion of the grown layer, the concentration of tin is maintained null. Such a graded concentration of the additional element is shown in FIG. 6*b* wherein the axis of ordinates represents the concentration of the additional element on the positive side thereof and the concentration of the conductivity imparting impurity, in this case, antimony on the negative side thereof. The axis of abscissas represents a distance from the junction in each of the substrate and grown layer and its intersection with the axis of ordinates corresponds to the position of the junction and also to the concentration of the additional element at the junction assumed to be null.

The resulting structure is shown in FIG. 6*a* as including an antimony doped $n^+$ type substrate 1 and a grown intrinsic layer 2 thereon having a graded concentration of tin. The structure as shown in FIG. 6 is effective in that the stress generated in the vicinity of the junction in the material of the grown layer is gradually decreased.

It is well known that, unlike the diffusion technique, the crystal grown technique can comparatively readily form grown layers graded in impurity concentration thickness-wise thereof. For this reason, the lattice strain due to a change in lattice constant is also graded in the material of the grown layer. This results in the necessity of grading a concentration profile of the associated additional element for relieving the lattice strain as shown in FIG. 6*b*. It will be understood that to grade the concentration profile of the additional element can readily be accomplished by using the crystal growth technique.

Since the process of growing crystals from the gaseous phase is effective for forming a plurality of grown layer in stacked relationship, the invention can readily provides a plurality of grown layers disposed in stacked relationship on a substrate or its equivalent with each of the grown layers relieved in lattice strain. In the latter event, it is required to determine the type and concentration of an additional element to be introduced into each of the grown layers with due regard to the preceding layer as to the lattice constant and the conductivity type as well as the type and concentration of the conductivity imparting impurity for the preceding grown layer. For example, the structure shown in FIG. 2*a* may have deposed on the grown *i* layer 2 another grown layer (not shown) of silicon usually doped with boron and having a $p^+$ type conductivity. As boron has a tetrahedral covalent radius smaller than that of silicon as above described, tin may be added to the $p^+$ type grown layer to relieve the lattice strain of the latter.

While the invention has been described in conjunction with silicon, it is to be understood that the same is not restricted thereto or thereby and that numerous changes and modifications may be resorted to without departing from the spirit and scope of the invention. For example, the invention is equally applicable to semiconductive germanium, III–V compounds, II–VI compounds and mixtures thereof. For semiconductive germanium, silicon may be used at the present additional element. As an example, upon growing gallium arsenide (GaAs), an additional element involved has an atomic radius with its ion occupying a Ga site different from that with its ion occupying an As site resulting in a somewhat complicated mechanism. However, the invention is possible to relieve the lattice strain of the resulting GaAs structure. For hetro-junctions formed, for example, in a composite compound GaAs-$Ga_xAl_{1-x}As$, a difference in lattice constant is large. In that event the invention gives the more effective results.

What is claimed is:

1. A semiconductor body relieved in lattice strain including, a semiconductor substrate layer, an epitaxially grown semiconductor layer disposed on said substrate layer, one of said substrate and grown layers being of semiconductive material having a low impurity concentration and a lattice constant approximately equal to a lattice constant of the corresponding intrinsic semiconductive material while the other layer is of a very extrinsic semiconductive material different in lattice constant from the semiconductive material having a low impurity concentration and an additional element different in atomic radius from the material of said substrate layer in the material of the grown layer during the epitaxial growth thereof and having a concentration sufficient to render the material of said grown layer substantially equal in lattice constant to said substrate said additional element being selected from the group consisting of tin, zirconium, hafnium silicon, germanium, lead, conductivity imparting impurity elements of the Groups III and V, vanadium and niobium.

2. A semiconductor body as claimed in claim 1, wherein said substrate layer comprises a semiconductive material with antimony as a dopant and said grown layer comprising said semiconductive material having a low impurity concentration and having added thereto one element selected from the group consisting of tin and germanium.

3. A semiconductor body as claimed in claim 1, wherein said substrate layer comprises semiconductive material having a low impurity concentration and said grown layer comprises a semiconductive material having phosphorous as a dopant and having added thereto one element selected from the group consisting of tin and germanium.

4. A semiconductor body as claimed in claim 1, wherein said substrate layer comprises a semiconductive material with antimony as a dopant and said grown layer comprising semiconductive material having a low impurity concentration and having added thereto, one element selected from the group consisting of tin and germanium, said one element with a graded concentration profile sufficient to cause the materials of both the layers to be substantially equal in lattice constant at and adjacent a junction formed between both said layers and gradually decrease to a null value.

5. A semiconductor body as claimed in claim 1, wherein said substrate layer comprises semiconductive material having a low impurity concentration and said grown layer comprises semiconductive material with boron as dopant and having added thereto one element selected from the group consisting of tin, germanium, and gallium.

6. A semiconductor body relieved in lattice strain including, a semiconductor substrate layer, an epitaxially grown semiconductor layer disposed on said substrate layer, one of said substrate and grown layers being of silicon having a low impurity concentration and a lattice constant approximately equal to a lattice constant of intrinsic silicon while the other layer is of a very extrinsic semiconductive material different in lattice constant from the silicon having a low impurity concentration, and an additional element different in atomic radius from the material of said substrate layer in the material of the grown layer during the epitaxial growth thereof and having a concentration sufficient to render the material of said grown layer substantially equal in lattice constant to said substrate, said additional element being selected from the group consisting of tin, zirconium, hafnium, silicon, germanium, lead, conductivity imparting impurity elements of the Groups III and V, vanadium and niobium.

* * * * *